United States Patent
Lai et al.

(10) Patent No.: US 11,675,340 B2
(45) Date of Patent: Jun. 13, 2023

(54) SYSTEM AND METHOD FOR CONTROLLING SEMICONDUCTOR MANUFACTURING APPARATUS

(71) Applicant: NANYA TECHNOLOGY CORPORATION, New Taipei (TW)

(72) Inventors: Wen-Hsiang Lai, Taoyuan (TW);
Yi-Shun Hung, Taoyuan (TW);
Chih-Jui Chien, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 429 days.

(21) Appl. No.: 16/843,506

(22) Filed: Apr. 8, 2020

(65) Prior Publication Data
US 2021/0320021 A1    Oct. 14, 2021

(51) Int. Cl.
*G05B 19/418* (2006.01)
*H01L 21/67* (2006.01)
(Continued)

(52) U.S. Cl.
CPC ... *G05B 19/41875* (2013.01); *G06F 18/2415* (2023.01); *G06F 18/2433* (2023.01);
(Continued)

(58) Field of Classification Search
USPC .............. 382/149, 159; 438/16; 324/762.05; 700/121
See application file for complete search history.

(56) References Cited

U.S. PATENT DOCUMENTS 6,292,582 B1 * 9/2001 Lin .................. G01N 21/95607
257/E23.179
6,885,977 B2 * 4/2005 Gavra .................... G06F 16/00
382/145
(Continued)

FOREIGN PATENT DOCUMENTS

TW    200415453 A    8/2004
TW    200424816 A    11/2004
(Continued)

OTHER PUBLICATIONS

Office Action dated Oct. 25, 2021 in TW Application No. 11015949, 19 pages.

*Primary Examiner* — Kathleen Y Dulaney
(74) *Attorney, Agent, or Firm* — Muncy, Geissler, Olds & Lowe, P.C.

(57) ABSTRACT

The present disclosure provides a system and a method for controlling a semiconductor manufacturing apparatus. The system includes an inspection unit capturing at least one image of a wafer, a sensor interface generating at least one input signal for a database server, and a control unit. The control unit includes a front-end subsystem, a calculation subsystem, and a message and tuning subsystem. The front-end subsystem receives the at least one input signal from the database server and performs a front-end process to generate a data signal. The calculation subsystem performs an artificial intelligence analytical process to determine, according to the data signal, whether damage marks have been caused by the semiconductor manufacturing apparatus and to generate an output signal. The message and tuning subsystem generates an alert signal and a feedback signal according to the output signal and transmits the alert signal to a user.

17 Claims, 12 Drawing Sheets

(51) Int. Cl.
*H01L 21/687* (2006.01)
*G06T 7/00* (2017.01)
*G06F 18/2415* (2023.01)
*G06F 18/2433* (2023.01)

(52) U.S. Cl.
CPC ...... *G06T 7/0004* (2013.01); *H01L 21/67288* (2013.01); *H01L 21/68707* (2013.01); *G05B 2219/32193* (2013.01); *G05B 2219/32368* (2013.01); *G05B 2219/33002* (2013.01); *G05B 2219/37224* (2013.01); *G06T 2207/30148* (2013.01)

(56) References Cited

U.S. PATENT DOCUMENTS

| | | | | |
|---|---|---|---|---|
| 2002/0024659 | A1* | 2/2002 | Tanaka | G06T 7/0002 356/237.2 |
| 2002/0121915 | A1* | 9/2002 | Alonso Montull | H01L 21/67288 324/754.03 |
| 2005/0004774 | A1* | 1/2005 | Volk | G01N 21/956 702/108 |
| 2005/0282299 | A1* | 12/2005 | Kim | G06T 7/0004 700/121 |
| 2010/0021042 | A1* | 1/2010 | Preil | G03F 1/84 382/144 |
| 2015/0064813 | A1* | 3/2015 | Ayotte | G06T 7/001 438/16 |
| 2015/0177161 | A1* | 6/2015 | Jingu | G01N 21/9501 356/244 |
| 2015/0254832 | A1* | 9/2015 | Plihal | G06N 20/00 382/149 |
| 2017/0262975 | A1* | 9/2017 | Fudeya | G06T 7/0008 |
| 2019/0073566 | A1* | 3/2019 | Brauer | G06V 10/776 |
| 2019/0206041 | A1* | 7/2019 | Fang | G06T 7/001 |
| 2019/0303717 | A1* | 10/2019 | Bhaskar | G06F 18/214 |
| 2019/0318948 | A1* | 10/2019 | Che | H01L 21/67748 |
| 2021/0158498 | A1* | 5/2021 | Saraswatula | G06T 7/0008 |

FOREIGN PATENT DOCUMENTS

| | | |
|---|---|---|
| TW | 200527172 A | 8/2005 |
| TW | 200949752 A1 | 12/2009 |
| TW | 201639175 A | 11/2016 |
| TW | 201735210 A | 10/2017 |
| TW | 201739951 A | 11/2017 |
| TW | 201810485 A | 3/2018 |
| TW | 201827962 A | 8/2018 |
| TW | 201933616 A | 8/2019 |
| TW | 201945996 A | 12/2019 |

* cited by examiner

| RANK | ROBOT NUM | LS |
|---|---|---|
| 1 | SWC302N | 0.9945 |
| 2 | SWB215N | 0.9833 |
| 3 | SWB217N | 0.9825 |
| 4 | SWB218N | 0.9755 |

SYSTEM AND METHOD FOR CONTROLLING SEMICONDUCTOR MANUFACTURING APPARATUS

TECHNICAL FIELD

The present disclosure relates to a system and a method for controlling an apparatus, and more particularly, to a system and a method for controlling a semiconductor manufacturing apparatus.

DISCUSSION OF THE BACKGROUND

Improvements with integration density have enabled rapid growth in the semiconductor industry. Semiconductor manufacturing apparatuses such as transfer robots form an indispensable part of many fabrication tools. A malfunction of these transfer robots is often discovered after a large quantity of wafers have already been damaged and scrapped. Human inspection and monitoring of the transfer robots result in lost processing time and defective products due to human error. Accordingly, systems and methods for controlling and monitoring the status of the transfer robots need to be effective in finding the faulty apparatus, as well as providing advanced warnings of various apparatus parameters.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a system for controlling a semiconductor manufacturing apparatus, comprising an inspection unit capturing at least one image of a wafer, a sensor interface receiving the at least one image and generating at least one input signal for a database server, and a control unit. The control unit comprises a front-end subsystem, a calculation subsystem, and a message and tuning subsystem. The front-end subsystem receives the at least one input signal from the database server and performs a front-end process to generate a data signal. The calculation subsystem receives the data signal from the front-end subsystem, wherein the calculation subsystem performs an artificial intelligence (AI) analytical process to determine, according to the data signal, whether one or more damage marks has been caused by the semiconductor manufacturing apparatus and to generate an output signal. The message and tuning subsystem generate an alert signal and a feedback signal according to the output signal, and the message and tuning subsystem transmits the alert signal to a user of the semiconductor manufacturing apparatus.

In some embodiments, the front-end process performed by the front-end subsystem comprises extracting, transforming, and/or loading the input signal from the database server.

In some embodiments, the AI analytical process performed by the calculation subsystem categorizes the images of the wafer in the data signal into an undamaged wafer group and a damaged wafer group.

In some embodiments, the AI analytical process performed by the calculation subsystem further utilizes an object recognition algorithm to identify the one or more damage marks in each of the images of the damaged wafer group, and a distance between the damage marks is determined.

In some embodiments, the AI analytical process performed by the calculation subsystem further utilizes a statistical model prediction to obtain a likelihood score of the semiconductor manufacturing apparatus corresponding to the images of the data signal.

In some embodiments, the message and tuning subsystem transmits the feedback signal for an automated tuning process of the semiconductor manufacturing apparatus according to the output signal.

In some embodiments, the semiconductor manufacturing apparatus comprises one or more transfer robots.

Another aspect of the present disclosure provides a system for monitoring a semiconductor manufacturing apparatus comprising an inspection unit capturing at least one image of a wafer, a sensor interface receiving the at least one image and generating at least one input signal for a database server, one or more processors, and one or more computer-readable non-transitory storage media. The one or more computer-readable non-transitory storage media is coupled to the one or more processors and includes instructions operable when executed by the one or more processors to cause the system to: receive the at least one input signal from the database server and perform a front end process to generate a data signal; perform an artificial intelligence (AI) analytical process to determine, according to the data signal, whether one or more damage marks has been caused by the semiconductor manufacturing apparatus and to generate an output signal; and generate an alert signal and a feedback signal according to the output signal, and transmit the alert signal to a user of the semiconductor manufacturing apparatus.

In some embodiments, the front-end process comprises extracting, transforming, and/or loading the input signal from the database server.

In some embodiments, the one or more computer-readable non-transitory storage media further comprises instructions operable when executed by the one or more processors to cause the system to perform the AI analytical process by categorizing the images of the wafer in the data signal into an undamaged wafer group and a damaged wafer group.

In some embodiments, the one or more computer-readable non-transitory storage media further comprises instructions operable when executed by the one or more processors to cause the system to perform the AI analytical process by further utilizing an object recognition algorithm to identify the one or more damage marks in each of the images of the damaged wafer group, and to determine a distance between the damage marks.

In some embodiments, the one or more computer-readable non-transitory storage media further comprises instructions operable when executed by the one or more processors to cause the system to perform the AI analytical process by further utilizing a statistical model prediction to obtain a likelihood score of the semiconductor manufacturing apparatus corresponding to the images of the data signal.

In some embodiments, the one or more computer-readable non-transitory storage media further comprises instructions operable when executed by the one or more processors to cause the system to transmit the feedback signal for an automated tuning process of the semiconductor manufacturing apparatus according to the output signal.

In some embodiments, the semiconductor manufacturing apparatus comprises one or more transfer robots.

Another aspect of the present disclosure provides a method for controlling a semiconductor manufacturing apparatus comprising: capturing, by an inspection unit, at least one image of a wafer; receiving, by a sensor interface, the at least one image and generating at least one input signal for a database server; receiving, by a front end subsystem, the at least one input signal from the database server and performing a front end process to generate a data signal; receiving, by a calculation subsystem, the data signal from the front end subsystem, the calculation subsystem performing an artificial intelligence (AI) analytical process to determine, according to the data signal, whether one or more damage marks has been caused by the semiconductor manufacturing apparatus and generating an output signal; and generating, by a message and tuning subsystem, an alert signal and a feedback signal according to the output signal, the message and tuning subsystem transmitting the alert signal to a user of the semiconductor manufacturing apparatus.

In some embodiments, the front-end process performed by the front-end subsystem further comprising extracting, transforming, and/or loading the input signal from the database server.

In some embodiments, the AI analytical process performed by the calculation subsystem further comprising categorizing the images of the wafer in the data signal into an undamaged wafer group and a damaged wafer group.

In some embodiments, the AI analytical process performed by the calculation subsystem further comprising utilizing an object recognition algorithm to identify the one or more damage marks in each of the images of the damaged wafer group, and a distance between the damage marks is determined.

In some embodiments, the AI analytical process performed by the calculation subsystem further comprising utilizing a statistical model prediction to obtain a likelihood score of the semiconductor manufacturing apparatus corresponding to the images of the data signal.

In some embodiments, the method further comprises transmitting, by the message and tuning subsystem, the feedback signal for an automated tuning process of the semiconductor manufacturing apparatus according to the output signal, wherein the semiconductor manufacturing apparatus comprises one or more transfer robots.

Accordingly, the system and the method for controlling semiconductor manufacturing apparatus provide automated AI analytical subsystems and processes capable of analyzing apparatus such as the transfer robot that may be causing wafer damage. Due to the control unit, which includes the intelligent calculation subsystem and the message and tuning subsystem, operators of the transfer robot can monitor and optimize the process parameters of the apparatus and receive advanced warnings regarding the status of the transfer robot. Moreover, due to the automated apparatus tuning in the control systems and methods, human judgment error, processing times, and the quantity of defective products can be minimized.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
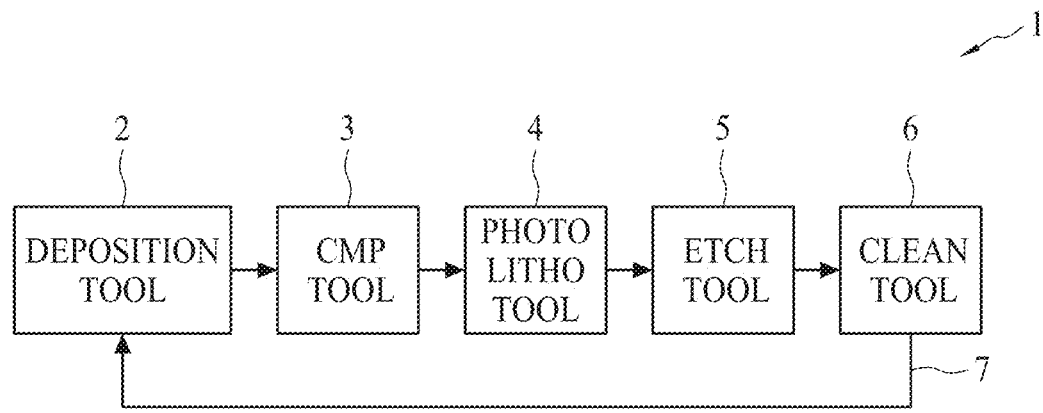
FIG. 1 is a block diagram of a semiconductor fabrication facility according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

To describe film-forming or deposition processes, the term "deposition" will generally be used herein for consistency. For film removal, the term "etch" will be used, and for a cleaning removal process, the term "clean" will be used. The figures may use other designations as applicable for illustrative clarity or convenience.

FIG. 1 is a block diagram of a semiconductor fabrication facility 1 according to some embodiments of the present disclosure. With reference to FIG. 1, the semiconductor fabrication facility 1 may include a plurality of semiconductor manufacturing apparatuses such as a deposition tool 2, a chemical mechanical polishing (CMP) tool 3, a photolithography tool 4, an etch tool 5, and a clean tool. Typically, a design of microelectronic devices to be formed in a wafer is produced, and a layout is made from the design. The layout may include sets of patterns that will be transferred to one or more stacked layers of materials that are applied to the wafer during its fabrication in a process sequence 7 to form the various circuits and devices on the substrate of the wafer. According to some embodiments, the process sequence 7 of the semiconductor fabrication facility 1 shown in FIG. 1 is an exemplary process flow which may be used several times to deposit or form films on a substrate of the wafer and pattern them using a variety of lithography and etch techniques. Such general fabrication steps may include a deposition process using the deposition tool 2, a planarization and/or polishing process using the CMP tool 3, an exposure process with a patterned wavelength of light using the photolithography tool 4, a removal process of the exposed portions of the film using the etch tool 5, and a cleaning process using the clean tool 6 in preparation for subsequent processing. It should be noted that, more steps than deposition, planarization, photolithography, etch, and cleaning may be utilized in the semiconductor fabrication facility 1 as would be understood by a person of ordinary skill in the art. Moreover, each of the steps of a deposition, planarization, photolithography, etch, and clean process may include various specific steps. Therefore, the process sequence 7 depicted in FIG. 1 should not be construed as limiting with respect to embodiments of the present disclosure. In some embodiments, examples of the deposition techniques used in the deposition tool 2 may include chemical vapor deposition (CVD), electrochemical deposition (ECD), physical vapor deposition (PVD), molecular beam epitaxy (MBE), atomic layer deposition (ALD), self-assembled monolayer (SAM) deposition and others. In some embodiments, the deposition techniques may be complemented by the creation of plasma so as to suitably affect the chemical reactivity of the processes occurring at the substrate surface. It should be further noted that, in some embodiments, each of the fabrication tools 2-6 may include a semiconductor manufacturing apparatus such as one or more transfer robots, as described later in the present disclosure, that serve to transfer the wafer during the process sequence 7.

Figure 2:
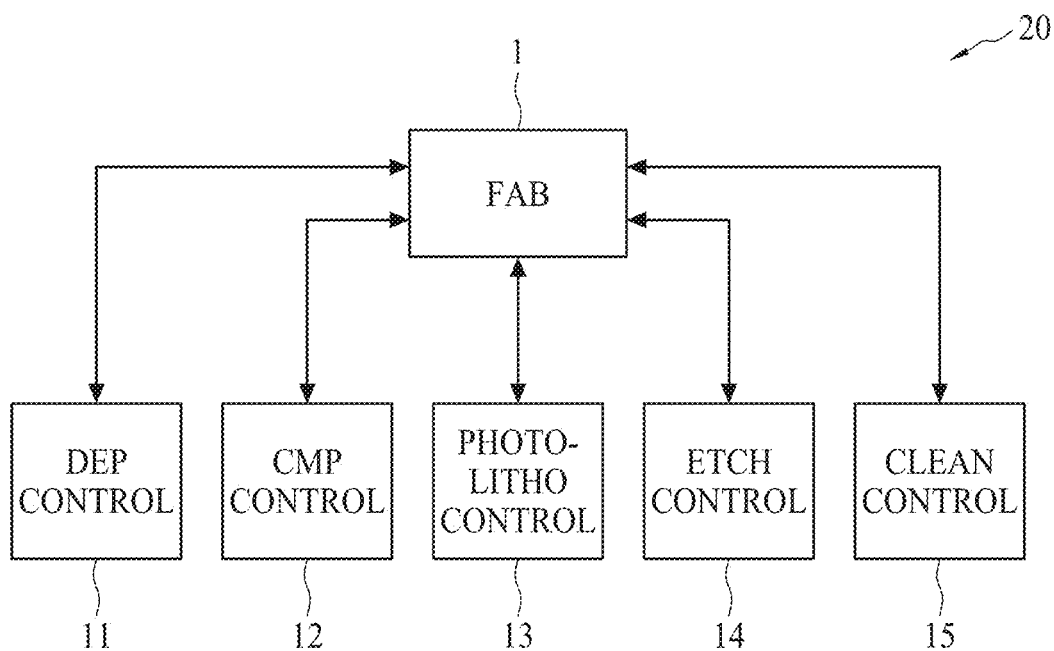
FIG. 2 is a block diagram of a control platform of a semiconductor fabrication facility according to some embodiments of the present disclosure.

FIG. 2 is a block diagram of a control platform 20 of the semiconductor fabrication facility 1 according to some embodiments of the present disclosure. With reference to FIG. 1 and FIG. 2, the control platform 20 includes a plurality of systems for controlling and monitoring the fabrication tools of the semiconductor fabrication facility 1. The control platform 20 may include a system 11 for controlling the deposition tool 2, a system 12 for controlling the CMP tool 3, a system 13 for controlling the photolithography tool 4, a system 14 for controlling the etch tool 5, and a system 15 for controlling the clean tool 6. In some embodiments, as described later in the present disclosure, the control systems 11-15 may include additional systems for controlling the transfer robots of the fabrication tools 2-6 in the semiconductor fabrication facility 1. Moreover, measurement or metrology data may be captured to control and optimize the fabrication processes performed by the fabrication tools of the semiconductor fabrication facility 1. For instance, the systems for controlling the transfer robots of the fabrication tools 2-6 may include a plurality of subsystems to control and monitor various parameters and settings in order to optimize the performance of the transfer robots in the fabrication tools 2-6 of FIG. 1, as described later in embodiments of the present disclosure.

Figure 3:
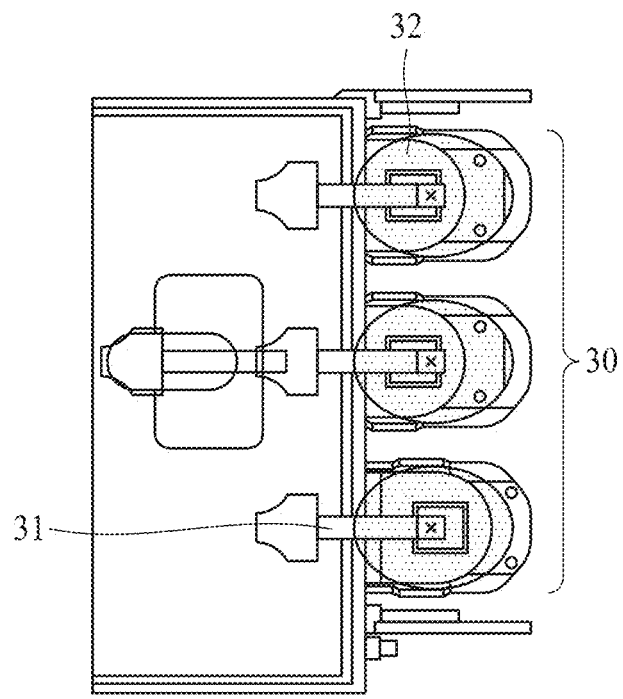
FIG. 3 is a schematic view of a transfer robot according to some embodiments of the present disclosure.
Figure 4:
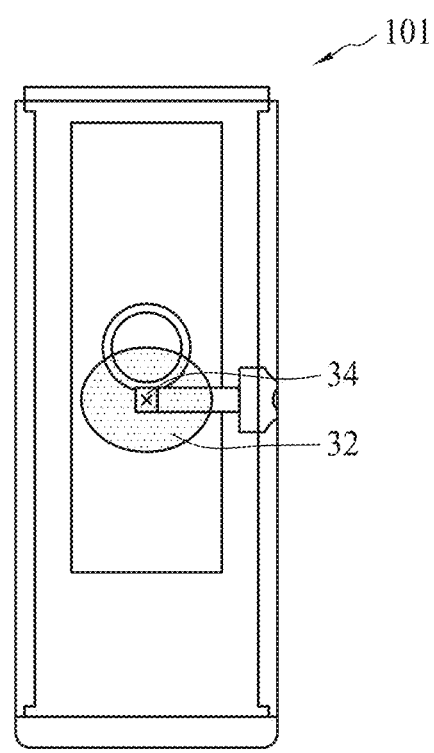
FIG. 4 is a schematic view of an inspection unit according to some embodiments of the present disclosure.

FIG. 3 is a schematic view of a transfer robot 30 according to some embodiments of the present disclosure. FIG. 4 is a schematic view of an inspection unit 101 according to some embodiments of the present disclosure. With reference to FIG. 3, the transfer robot 30 may include a plurality of robotic arms 31 for transferring a wafer 32 in a fabrication tool, such as the fabrication tools 2-6 in the semiconductor fabrication facility 1 depicted in FIG. 1, for example. In some embodiments, the robotic arms 31 of the transfer robot 30 may be motorized and programmed to execute various transport maneuvers as required by the fabrication tool. As shown in FIG. 4, in some embodiments, the inspection unit 101 may include at least one camera device 34 for capturing at least one image of the wafer 32. The images captured by the inspection unit 101 may serve as input images for controlling and optimizing various parameters and settings of the transfer robot 30. In some embodiments, the camera device 34 may be a complementary metal-oxide semiconductor (CMOS) camera, a charge-coupled device (CCD) camera, a video camera, or other suitable types of cameras or sensors. The camera device 34 may also be an area scan camera or a line scan camera, for example. Moreover, in some embodiments, the inspection unit 101 may include light sources as well as other complementary apparatuses to facilitate the capturing of the wafer images. In some embodiments, the inspection unit 101 may be integrated with the fabrication tool or the transfer robot 30, or the inspection unit may be part a separate standalone module. It should be noted that, the configuration and the quantity of the transfer robot 30 and the inspection unit 101 are not limited by what is shown in FIG. 3 and FIG. 4, and other configurations and quantities of the transfer robot 30 and the inspection unit 101 are possible. For example, there may be one or more of the transfer robots 30 and the inspection unit 101, for example.

Figure 5:
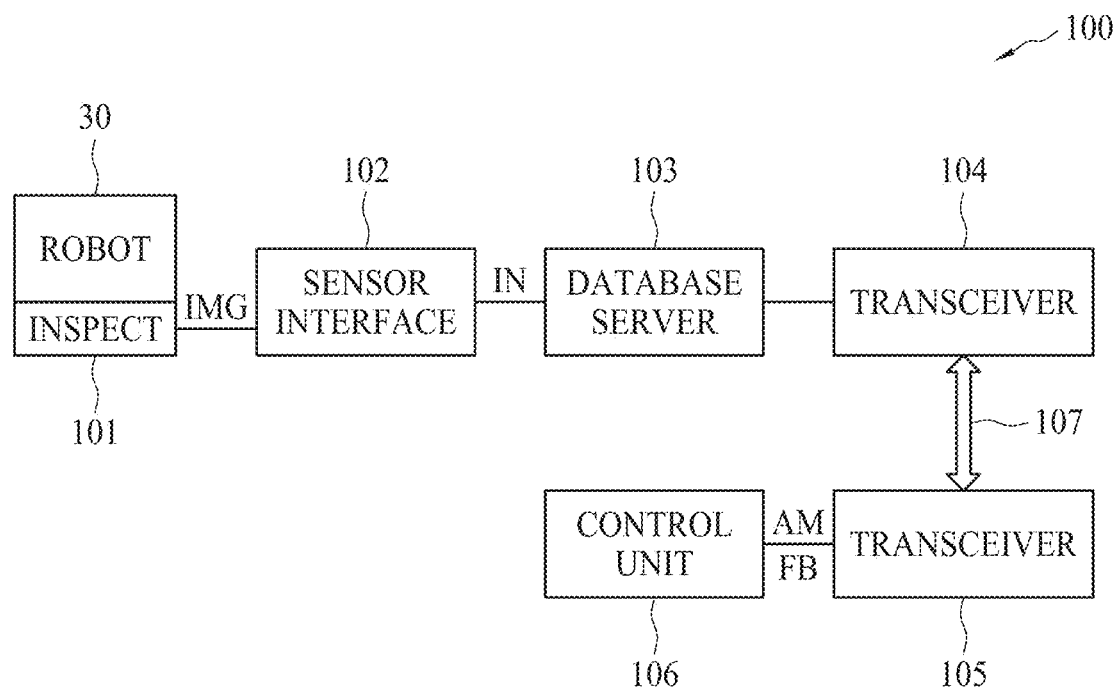
FIG. 5 is a block diagram of a system for controlling a semiconductor manufacturing apparatus according to some embodiments of the present disclosure.
Figure 6:
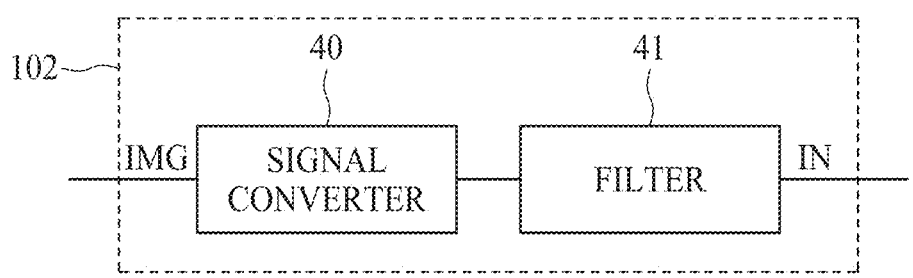
FIG. 6 is a block diagram of a sensor interface according to some embodiments of the present disclosure.
Figure 7:
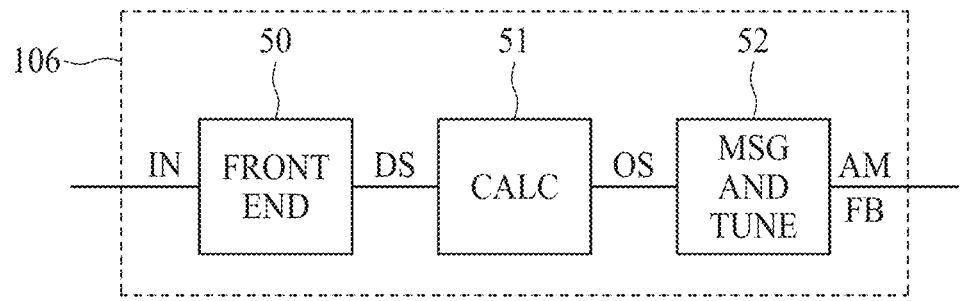
FIG. 7 is a block diagram of a control unit according to some embodiments of the present disclosure.

FIG. 5 is a block diagram of the system 100 for controlling a semiconductor manufacturing apparatus according to some embodiments of the present disclosure. FIG. 6 is a block diagram of a sensor interface 102 according to some embodiments of the present disclosure. FIG. 7 is a block diagram of a control unit 106 according to some embodiments of the present disclosure. With reference to FIG. 5 to FIG. 7, the system 100 for controlling the transfer robot 30 includes the inspection unit 101, the sensor interface 102, a database server 103, a first transceiver 104, a second transceiver 105, and the control unit 106. In some embodiments, the semiconductor manufacturing apparatus may include, for example, the transfer robot 30 depicted in FIG. 3, although the general operating principles of the system 100 may be applied to other control systems in the control platform 20 of the semiconductor fabrication facility 1. The inspection unit 101 provides captures at least one image IMG of the wafer 32. In some embodiments, the sensor interface 102 receives the at least one image IMG from the inspection unit 101 and generates at least one input signal IN for the database server 103, which may be a database server of a database warehouse, for example. The at least one input signal IN may be transmitted from the database server 103 by the first transceiver 104 to the second transceiver 105 through a network link 107. In some embodiments, the at least one input signal IN may be modulated when it is transmitted by the first transceiver 104 and demodulated when it is received by the second transceiver 105. The network link 107 may be any suitable type of network link based on wired or wireless technology known in the art, including but not limited to infrared, optical, or radio communication means. In some embodiments, the control unit 106 performs an artificial intelligence (AI) analytical process to determine, according to a data signal DS, whether one or more damage marks has been caused by the transfer robot 30. A feedback signal FB and an alert signal are generated according to an output signal OS. In some embodiments, the feedback signal FB from the control unit 106 is transmitted to the transfer robot 30 through the network link 107 between the second transceiver 105 and the first transceiver 104. In some embodiments, the feedback signal FB may be modulated when it is transmitted by the second transceiver 105 and demodulated when it is received by the first transceiver 104.

With reference to FIG. 6, the sensor interface 102 includes one or more signal converters 40 and one or more filters 41. In some embodiments, the signal converters 40 may include image file converters (e.g., image file compression converters), analog-to-digital (A/D) converters, digital-to-analog (D/A) converters, or other suitable signal converters. When generating the input signal IN for the database server 103, the signal converters 40 of the sensor interface 102 may convert the image IMG to another image format, convert the image IMG from a raw image file to a compressed image file, convert the image IMG from a compressed image file to a raw image file, or perform other suitable types of conversions. The filters 41 may include photography filers, antialias filters, low-pass filters, high-pass filters, band-pass filters, or other suitable filters for the particular application of the system 100. The filters 41 may be used to improve the signal to noise ratio of the input signal IN, for instance.

With reference to FIG. 7, the control unit 106 includes a front-end subsystem 50, a calculation subsystem 51, and a message and tuning subsystem 52. In some embodiments, the front-end subsystem 50 receives the at least one input signal IN from the database server 103 and performs a front-end process to generate a data signal DS. The calculation subsystem 51 receives the data signal DS from the front end subsystem 51, and the calculation subsystem 51 performs the AI analytical process to determine, according to the data signal DS, whether one or more damage marks has been caused by the transfer robot 30 and to generate the output signal OS. The message and tuning subsystem 52 generates the alert signal AM and the feedback signal FB according to the output signal OS, and the message and tuning subsystem transmits the alert signal AM to a user of the transfer robot 30.

Figure 8:
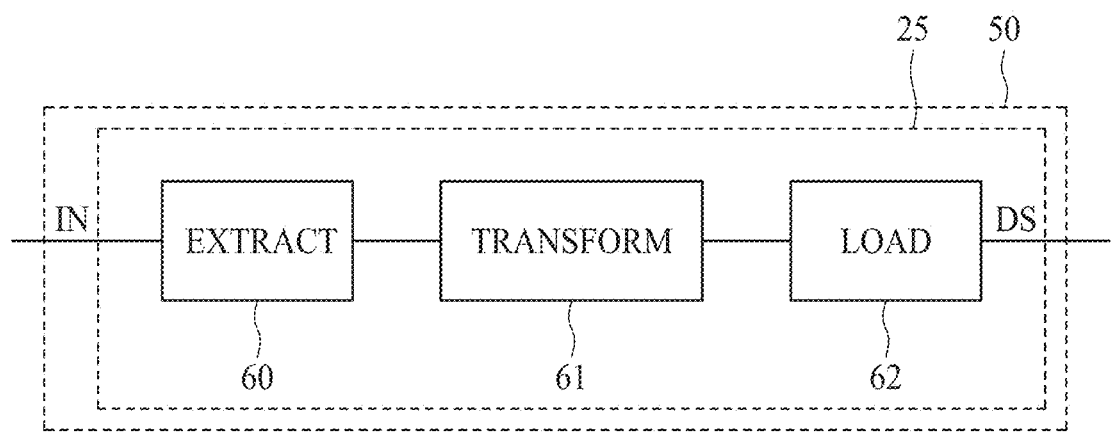
FIG. 8 is a block diagram of a front-end subsystem according to some embodiments of the present disclosure.

FIG. 8 is a block diagram of the front-end subsystem 50 according to some embodiments of the present disclosure. With reference to FIG. 8, the front-end subsystem 50 may include an extract-transform-load (ETL) module 25 for performing the front-end process, which may include extracting, transforming, and/or loading the input signal IN from the database server 103. In some embodiments, as shown in FIG. 8, the ETL module 25 includes an extract block 60, a transform block 61, and a load block 62. In some embodiments, the extract block 60 may unpack and extract the at least one input signal IN from the database server 103. The transform block 61 may perform suitable data transformation, integrity and confirmation procedures. The load block 62 may generate and load the data signal DS according to the transform process performed by the transform block 61, such that the calculation subsystem 51 is able to use the data signal DS for the AI analytical process.

Figure 9:
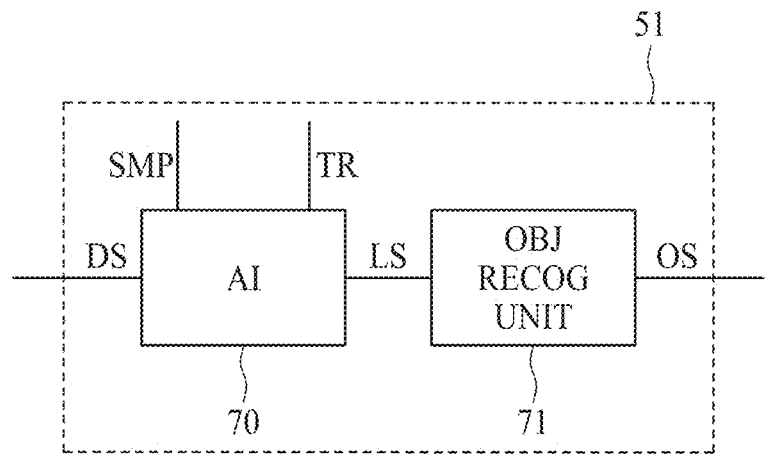
FIG. 9 is a block diagram of a calculation subsystem according to some embodiments of the present disclosure.
Figure 10:
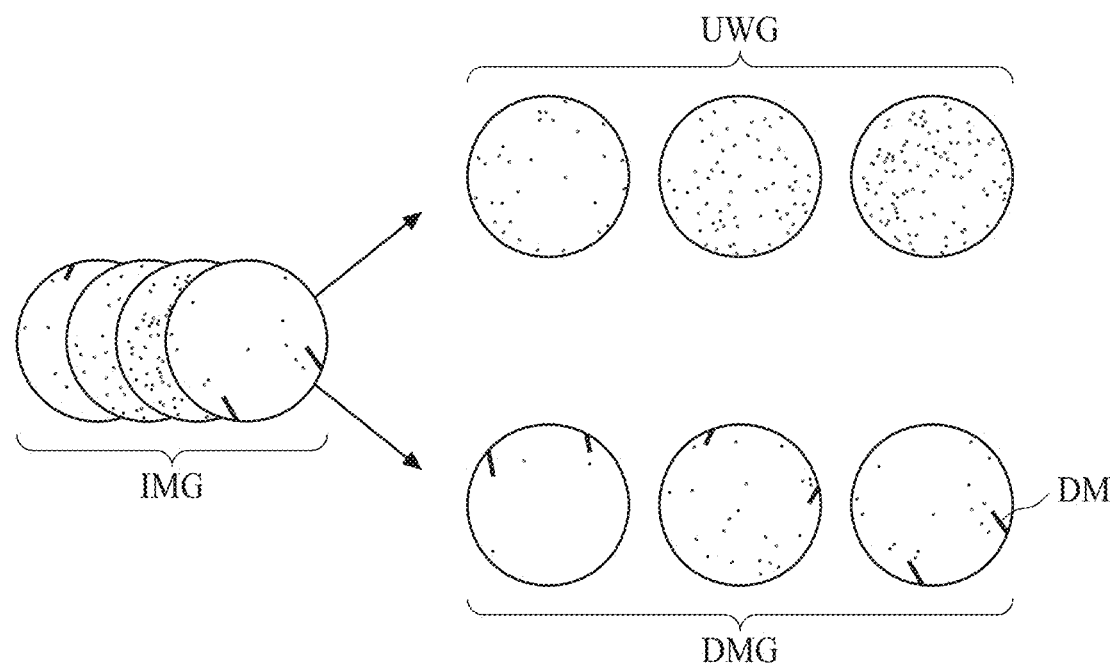
FIG. 10 is a schematic view of a categorization process according to some embodiments of the present disclosure.
Figures 11, 12:
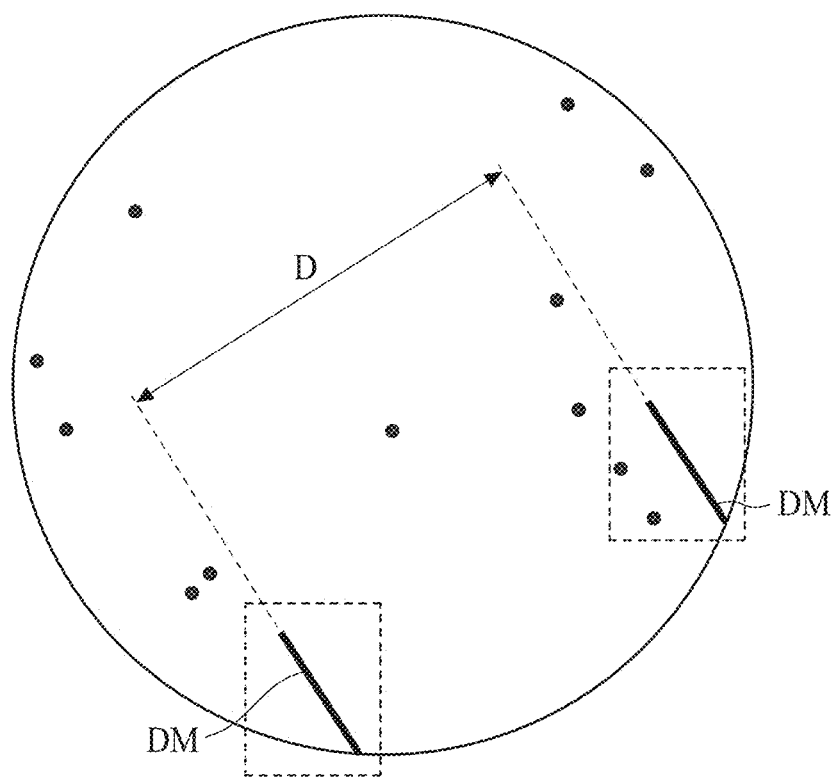
FIG. 11 is a schematic view of an object recognition process according to some embodiments of the present disclosure.
FIG. 12 is a sample chart containing the likelihood score LS of the transfer robot 30 according to some embodiments of the present disclosure.

FIG. 9 is a block diagram of the calculation subsystem 51 according to some embodiments of the present disclosure. FIG. 10 is a schematic view of a categorization process according to some embodiments of the present disclosure. FIG. 11 is a schematic view of an object recognition process according to some embodiments of the present disclosure. With reference to FIG. 9 to FIG. 11, the calculation subsystem 51 includes an AI analysis unit 70 and an object recognition unit 71. In some embodiments, the calculation subsystem 51 performs the AI analytical process to determine, according to the data signal DS, whether one or more damage marks DM has been caused by the transfer robot 30 and to generate the output signal OS. In some embodiments, the AI analytical process performed by the AI analysis unit 70 of the calculation subsystem 51 categorizes the images IMG of the wafer 32 in the data signal DS into an undamaged wafer group UWG and a damaged wafer group DWG, as shown in FIG. 10, for example. In some embodiments, the AI analytical process performed by the object recognition unit 71 of the calculation subsystem 51 utilizes an object recognition algorithm to identify the one or more damage marks DM in each of the images IMG of the damaged wafer group DWG, and to determine a distance D between the damage marks DM, as shown in FIG. 11. In some embodiments, the object recognition algorithm may be a deep learning object recognition algorithm based on neural networks, for example, although other suitable object recognition approaches may be used, such as machine learning algorithms. In some embodiments, the distance D between the damage marks DM may be determined by linear detection metrics that measure the distance D between the center points of the damage marks DM, for example. It should be noted that, other suitable distance metrics known in the art may be used, such as techniques used in machine learning, for example. In some embodiments, the AI analytical process performed by the AI analysis unit 70 of the calculation subsystem 51 further utilizes a statistical model prediction SMP to obtain a likelihood score LS of the transfer robot 30 corresponding to the images IMG of the data signal DS based on a set of training data TR. FIG. 12 is a sample chart containing the likelihood score LS of the transfer robot 30 according to some embodiments of the present disclosure. As shown in FIG. 12, in one example, the statistical model prediction SMP performed by the AI analysis unit 70 may rank a number of the transfer robot 30 according to their likelihood scores LS. In FIG. 12, the serial numbers in the middle column are merely used as examples of the serial numbers for the transfer robot 30, and the top ranked transfer robot 30 has the highest likelihood score LS corresponding to the images IMG of the data signal DS based on the set of training data TR. It should be noted that, the training data TR may be a set of previously recorded images of the transfer robot 30 that is used in the statistical model prediction SMP, for example. Accordingly, in some embodiments, the output signal OS generated by the calculation subsystem 51 may contain data such as the likelihood score LS of the transfer robot 30, the location of the damage marks DM, the distance D between the damage marks DM, as well as other pertinent data that may be requested by the user of the transfer robot 30.

Figure 13:
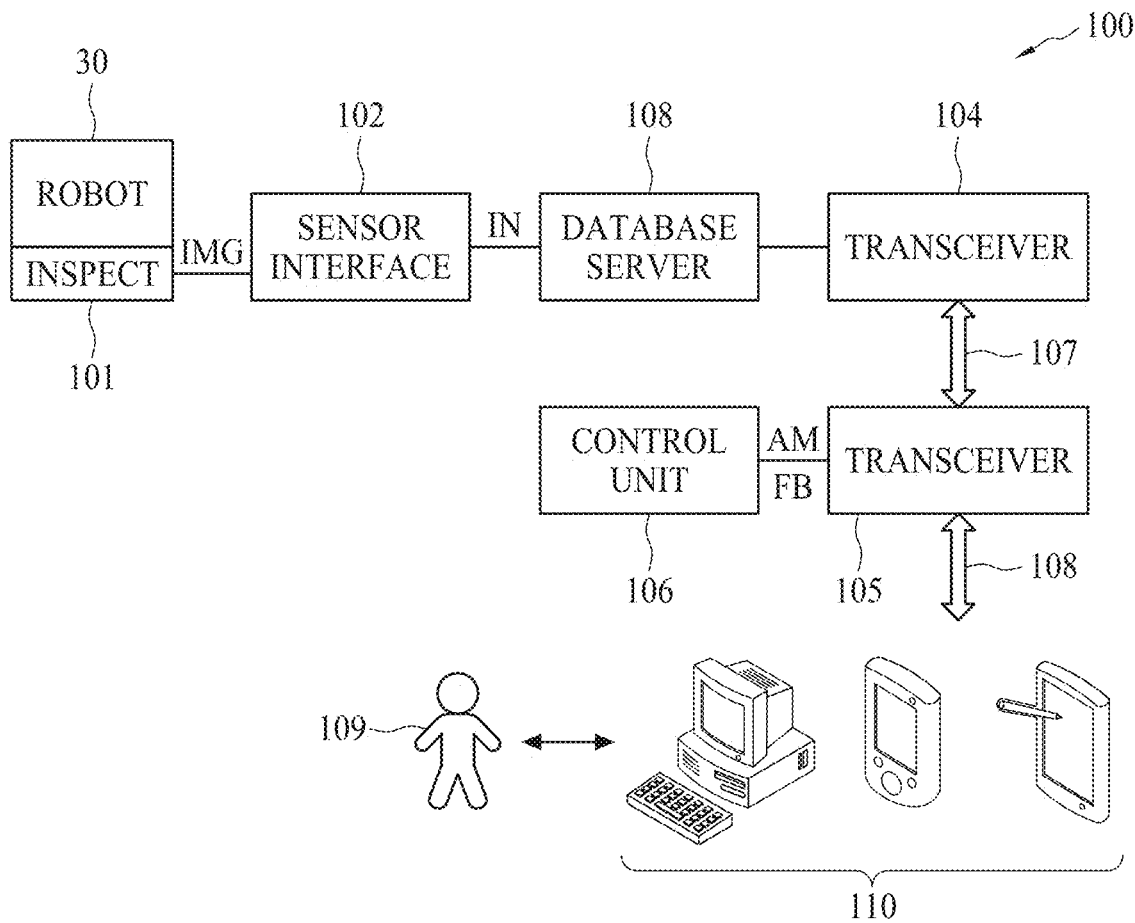
FIG. 13 is a block diagram depicting a system for controlling a semiconductor manufacturing apparatus and a user thereof according to some embodiments of the present disclosure.
Figure 14:
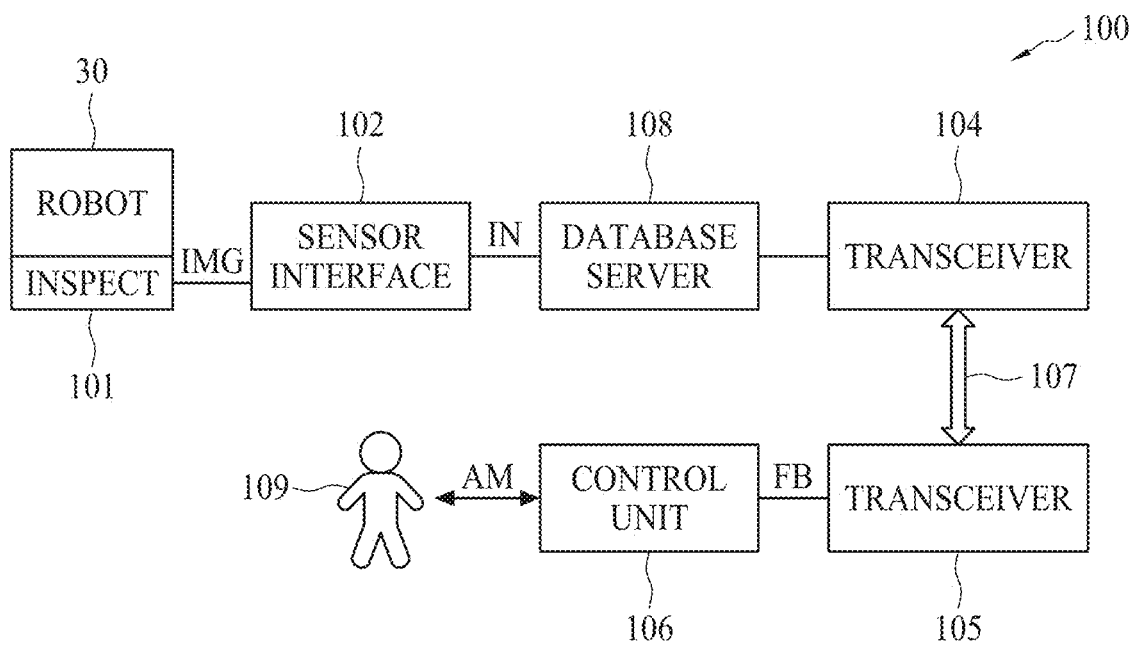
FIG. 14 is a block diagram depicting a system for controlling a semiconductor manufacturing apparatus and a user thereof according to some embodiments of the present disclosure.
Figure 15A:
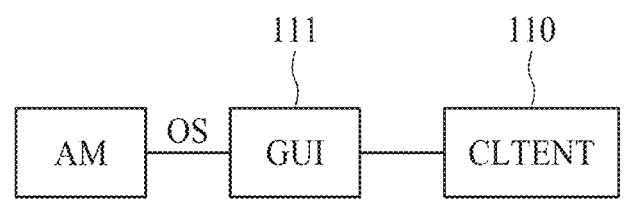
FIG. 15A is a relational diagram showing a relationship between an alert signal and components thereof according to some embodiments of the present disclosure.
Figure 15B:
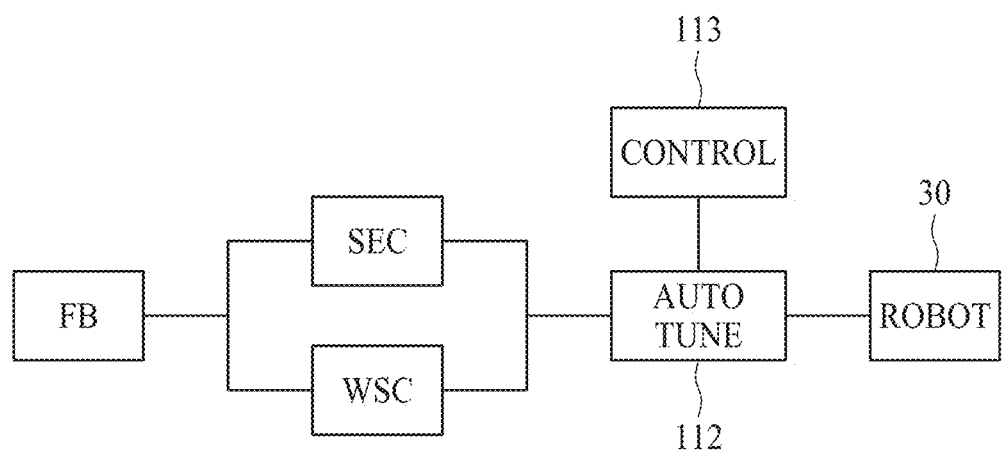
FIG. 15B is a relational diagram showing a relationship between a feedback signal and components thereof according to some embodiments of the present disclosure.

In some embodiments, the message and tuning subsystem 52 generates the alert signal AM according to the output signal OS from the calculation subsystem 51. In some embodiments, the alert signal AM may be sent to a user of the transfer robot 30. FIG. 13 and FIG. 14 are block diagrams depicting the system 100 for controlling the semiconductor manufacturing apparatus and a user thereof according to some embodiments of the present disclosure. FIG. 15A is a relational diagram showing a relationship between an alert signal and components thereof according to some embodiments of the present disclosure. FIG. 15B is a relational diagram showing a relationship between a feedback signal and components thereof according to some embodiments of the present disclosure. With reference to FIGS. 13 and 14, in some embodiments, the message and tuning subsystem 52 may transmit the alert signal AM to the user 109 through a network link 108 established between the second transceiver 105 and a client system 110. As shown in FIG. 13, the client system 109 may be, for example, a desktop computer, a notebook computer, a smart phone, a tablet computer, or the like capable of displaying the alert signal AM to the user 108. With reference to FIG. 15A, the contents of the alert signal AM, which may include data included in the output signal OS, may be presented in a graphical user interface (GUI) 111 on the client system 109. The network link 108 may be any suitable type of network link based on wired or wireless technology known in the art, including but not limited to infrared, optical, or radio communication means. The alert signal AM may be transmitted to the client system 109 via electronic mail, instant messaging applications, or the like. The network links 107 and 108 may be part of a same network or different networks. The network links 107 and 108 may be part of an intranet, an extranet, an ad hoc network, a virtual private network (VPN), a local area network (LAN), a wireless LAN (WLAN), a wireless WAN (WWAN), a wide area network (WAN), a metropolitan area network (MAN), a portion of the Internet, a portion of the Public Switched Telephone Network (PSTN), a cellular telephone network, or a combination of two or more of these. In some embodiments, as shown in FIG. 14, the alert signal AM may also be directly supplied and displayed by the control unit 106 to the user 109. In some embodiments, the alert signal AM gives the user 109 advanced warnings regarding the status of the transfer robot 30, such as which robots has the highest likelihood of causing scratches, contamination, or other damages to the wafer 32, and whether automated tuning processes are scheduled.

With reference to FIG. 15B, in some embodiments, when the feedback signal FB is transmitted to the transfer robot 30 for an automated tuning process 112, the transfer robot 30 is automatically tuned according to the output signal OS. For instance, the feedback signal FB may include a stop apparatus command SEC, and/or a wafer scrap command WSC according to the output signal OS. In some embodiments, the feedback signal FB may also include other commands such as alignment adjustment commands, power adjustment commands, or other process tuning commands. In some embodiments, the transfer robot 30 may be automatically adjusted run-to-run with reference to the feedback signal FB. It should be noted that, the feedback signal FB may be used directly by the transfer robot 30 for the automated tuning process 112, or the feedback signal FB may be transmitted to a separate controller 113 to control the automated tuning process 112 of the transfer robot 30.

Figure 16:
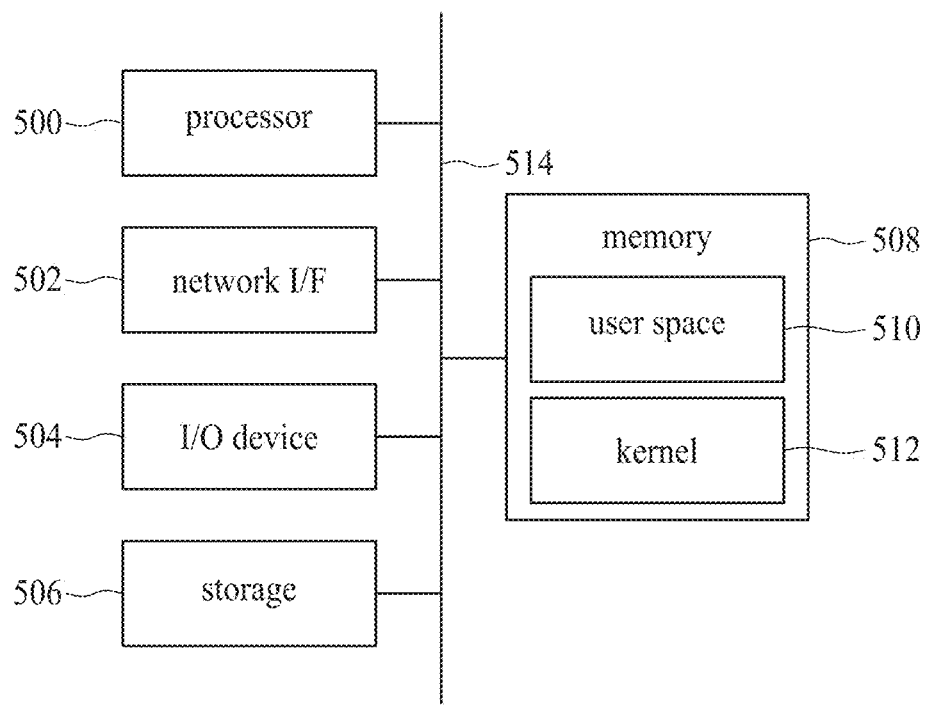
FIG. 16 is a block diagram of a computer system according to some embodiments of the present disclosure.

It should be noted that one or more of the tools, subsystems, methods, or operations described in the present disclosure may be realized by a computer system including instructions operable when executed by one or more processors of the computer system. For example, the control unit 106 and a method 600 described later in the present disclosure may be implemented by a computer system depicted in FIG. 16. FIG. 16 is a block diagram of a computer system 80 according to some embodiments of the present disclosure. With reference to FIG. 16, the computer system 80 may include one or more processors 500, a network interface (I/F) 502, a storage device 506, a memory 508, and an input/output (I/O) device 504 communicatively coupled via a bus 514 or other interconnection communication mechanism. The memory 508 includes, in some embodiments, a random access memory (RAM), other dynamic storage device, read-only memory (ROM), or other static storage device, coupled to the bus 514 for storing data or instructions to be executed by the one or more processors 500, and the memory 508 may include a kernel 512, a user space 510, portions of the kernel or the user space, and components thereof. The memory 508 is also used, in some embodiments, for storing temporary variables or other intermediate information during execution of instructions to be executed by the one or more processors 500.

In some embodiments, the storage device 506 is coupled to the bus 514 for transferring data or instructions to, for example, the kernel 512, user space 510, etc. In some embodiments, the operations and functionalities are realized as functions of a program stored in the storage device 506, which may include one or more computer-readable non-transitory storage media coupled to the one or more processors 500. Examples of the computer-readable non-transitory storage media include, but are not limited to, external/removable or internal/built-in storage or memory unit, e.g., one or more of an optical disk, such as a DVD, a magnetic disk, such as a hard disk, a semiconductor memory, such as a ROM, a RAM, a memory card, and the like. In some embodiments, the computer-readable non-transitory storage media of the storage device 506 includes instructions operable when executed by the one or more processors 500 to cause the system 100 to receive the at least one input signal IN from the database server 103 and perform a front end process to generate the data signal DS; perform the AI analytical process to determine, according to the data signal DS, whether one or more damage marks DM has been caused by the semiconductor manufacturing apparatus and to generate the output signal OS; and generate the alert signal AM and the feedback signal FB according to the output signal OS, and transmit the alert signal AM to the user 109 of the semiconductor manufacturing apparatus. In some embodiments, the front-end process includes extracting, transforming, and/or loading the input signal IN from the database server 103. In some embodiments, the one or more computer-readable non-transitory storage media further includes instructions operable when executed by the one or more processors 500 to cause the system 100 to perform the AI analytical process by categorizing the images IMG of the wafer 32 in the data signal DS into the undamaged wafer group UWG and the damaged wafer group DWG. In some embodiments, the one or more computer-readable non-transitory storage media further includes instructions operable when executed by the one or more processors 500 to cause the system 100 to perform the AI analytical process by further utilizing the object recognition algorithm to identify the one or more damage marks DM in each of the images IMG of the damaged wafer group DWG, and to determine the distance D between the damage marks DM. In some embodiments, the one or more computer-readable non-transitory storage media further includes instructions operable when executed by the one or more processors 500 to cause the system 100 to perform the AI analytical process by further utilizing the statistical model prediction SMP to obtain the likelihood score LS of the semiconductor manufacturing apparatus corresponding to the images IMG of the data signal DS. In some embodiments, the one or more computer-readable non-transitory storage media further includes instructions operable when executed by the one or more processors 500 to cause the system 100 to transmit the feedback signal FB for an automated tuning process of the transfer robot 30 according to the output signal OS. In some embodiments, the semiconductor manufacturing apparatus includes one or more transfer robots 30.

In some embodiments, the I/O device 604 includes an input device, an output device, or a combined input/output device for enabling user interaction with the analysis unit 105. An input device includes, for example, a keyboard, keypad, mouse, trackball, trackpad, or cursor direction keys for communicating information and commands to the processor 500. An output device includes, for example, a display, a printer, a voice synthesizer, etc. for communicating information to a user. In some embodiments, one or more operations or functionalities of the tools, subsystems, and methods described in the present disclosure are realized by the one or more processors 500 of the computer system 80, which is programmed for performing such operations and functionalities. One or more of the memory 508, the network I/F 502, the storage device 506, the I/O device 504, and the bus 514 are operable to receive instructions, data, design rules, netlists, layouts, models and other parameters for processing by the processor 500. In some embodiments, one or more of the operations and functionalities of the tools, subsystems, and methods described in the present disclosure may be implemented by specifically configured hardware (e.g., by one or more application specific integrated circuits (ASICs)) separate from or in lieu of the processor 500. Some embodiments incorporate more than one of the described operations or functionality in a single ASIC.

Figure 17:
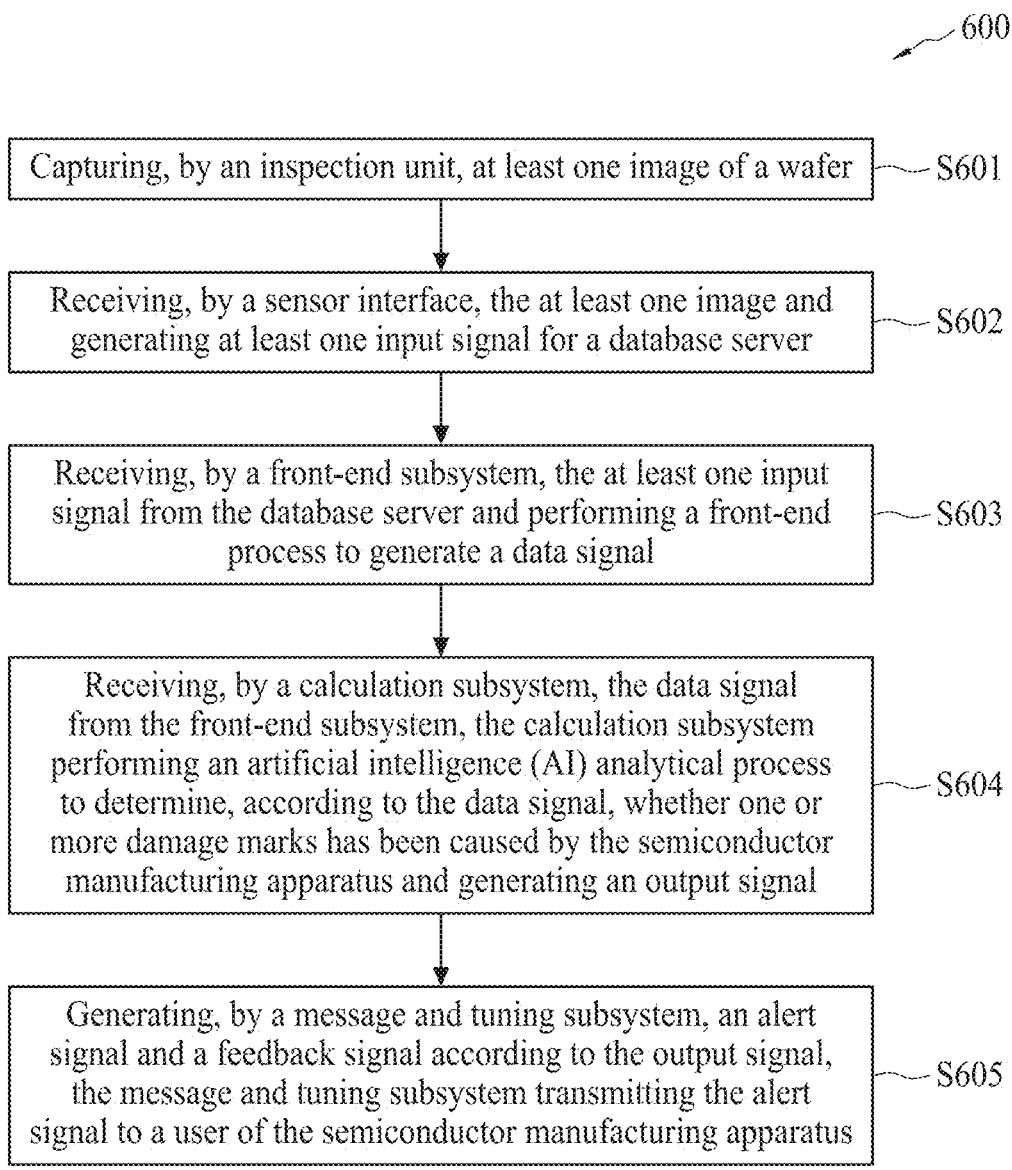
FIG. 17 is a flow diagram of a method for controlling a semiconductor manufacturing apparatus according to some embodiments of the present disclosure.

FIG. 17 is a flow diagram of a method 600 for controlling a semiconductor manufacturing apparatus according to some embodiments of the present disclosure. In some embodiments, the method 600 may be implemented by the system 100 depicted in FIG. 5 to FIG. 9, and the method 600 may also be realized by the computer system 80 depicted in FIG. 16. With reference to FIG. 17, the method 600 for controlling the semiconductor manufacturing apparatus includes: capturing, by the inspection unit 101, the at least one image IMG of the wafer 32 (Step S601); receiving, by the sensor interface 102, the at least one image IMG and generating the at least one input IN signal for the database server 103 (Step S602); receiving, by the front end subsystem 50, the at least one input signal IN from the database server 103 and performing the front end process to generate the data signal DS (Step S603); receiving, by the calculation subsystem 51, the data signal DS from the front end subsystem 50, the calculation subsystem 51 performing the artificial intelligence (AI) analytical process to determine, according to the data signal DS, whether one or more damage marks DM has been caused by the semiconductor manufacturing apparatus and generating the output signal OS (Step S604); and generating, by the message and tuning subsystem 52, the alert signal AM and the feedback signal FB according to the output signal OS, the message and tuning subsystem 52 transmitting the alert signal AM to the user 109 of the semiconductor manufacturing apparatus (Step S605).

Figure 18:
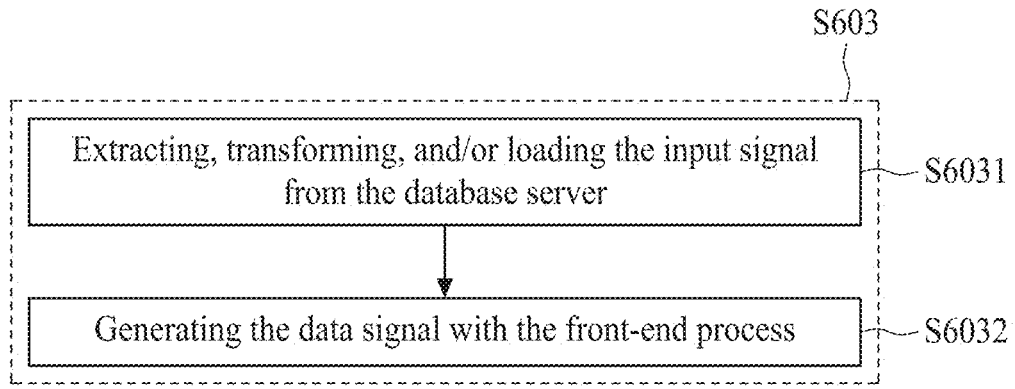
FIG. 18 is a flow diagram of a step in a method for controlling a semiconductor manufacturing apparatus according to some embodiments of the present disclosure.

FIG. 18 is a flow diagram of the Step S603 in the method 600 according to some embodiments of the disclosure. In some embodiments, the front-end process performed by the front-end subsystem further includes extracting, transforming, and/or loading the input signal IN from the database server 103 (Step S6031); and generating the data signal DS with the front-end process (Step S6032).

Figure 19:
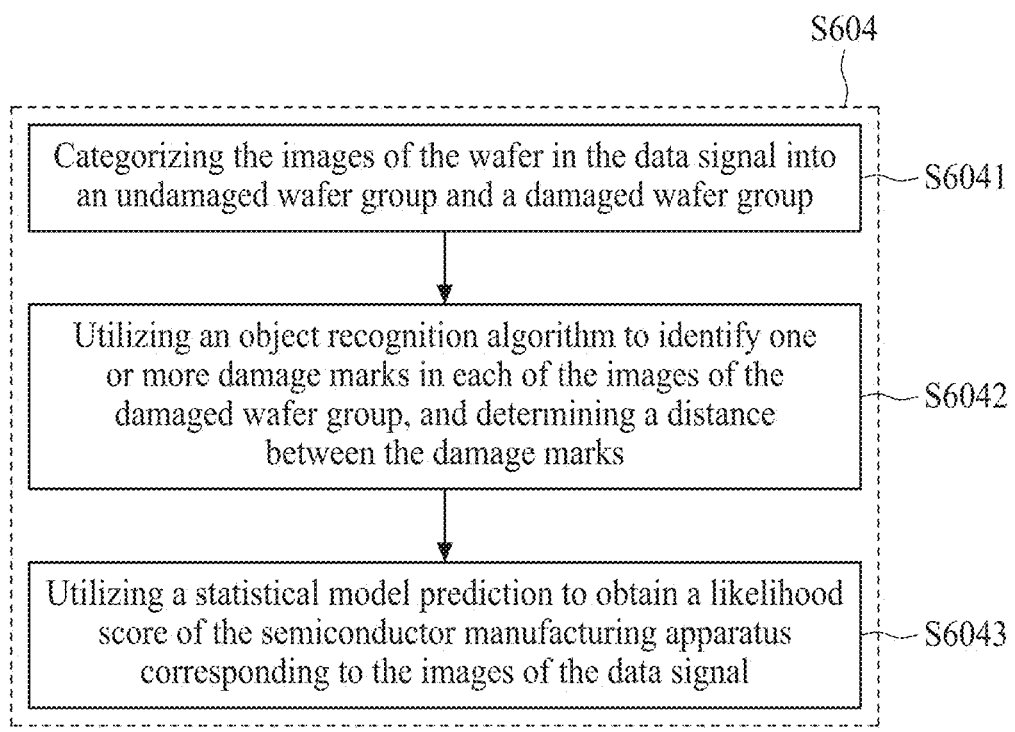
FIG. 19 is a flow diagram of a step in a method for controlling a semiconductor manufacturing apparatus according to some embodiments of the present disclosure.

FIG. 19 is a flow diagram of the Step S604 in the method 600 according to some embodiments of the disclosure. In some embodiments, the AI analytical process performed by the calculation subsystem 51 further includes categorizing the images IMG of the wafer 32 in the data signal DS into the undamaged wafer group UWG and the damaged wafer group DWG (Step S6041). In some embodiments, the AI analytical process performed by the calculation subsystem 51 further includes utilizing the object recognition algorithm to identify the one or more damage marks DM in each of the images IMG of the damaged wafer group DWG, and the distance D between the damage marks DM is determined (Step S6042). In some embodiments, the AI analytical process performed by the calculation subsystem 51 further includes utilizing the statistical model prediction SWP to obtain the likelihood score LS of the semiconductor manufacturing apparatus corresponding to the images IMG of the data signal DS (Step S6043).

Figure 20:
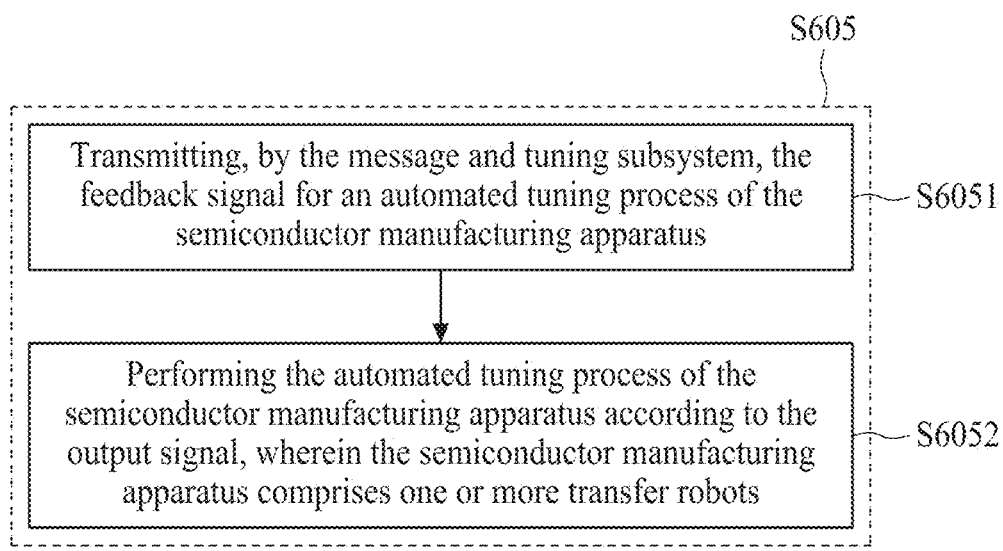
FIG. 20 is a flow diagram of a step in a method for controlling a semiconductor manufacturing apparatus according to some embodiments of the present disclosure.

FIG. 20 is a flow diagram of the Step S605 in the method 600 according to some embodiments of the disclosure. In some embodiments, the method 600 further includes transmitting, by the message and tuning subsystem 52, the feedback signal FB for the automated tuning process 112 of the semiconductor manufacturing apparatus (Step S6051); and performing the automated tuning process 112 according to the output signal OS, in which the semiconductor manufacturing apparatus includes one or more transfer robots 30 (Step S6052).

Accordingly, the system 100 and the method 600 for controlling semiconductor manufacturing apparatus provide automated AI analytical subsystems and processes capable of analyzing apparatus such as the transfer robot 30 that may be causing wafer damage. Due to the control unit 106, which includes the intelligent calculation subsystem 51 and the message and tuning subsystem 52, operators of the transfer robot 30 can monitor and optimize the process parameters of the apparatus and receive advanced warnings regarding the status of the transfer robot 30. Moreover, due to the automated apparatus tuning of the system 100 and the method 600, human judgment error, processing times, and the quantity of defective products can be minimized.

One aspect of the present disclosure provides a system for controlling a semiconductor manufacturing apparatus, comprising an inspection unit capturing at least one image of a wafer, a sensor interface receiving the at least one image and generating at least one input signal for a database server, and a control unit. The control unit comprises a front-end subsystem, a calculation subsystem, and a message and tuning subsystem. The front-end subsystem receives the at least one input signal from the database server and performs a front-end process to generate a data signal. The calculation subsystem receives the data signal from the front-end subsystem, wherein the calculation subsystem performs an artificial intelligence (AI) analytical process to determine, according to the data signal, whether one or more damage marks has been caused by the semiconductor manufacturing apparatus and to generate an output signal. The message and tuning subsystem generate an alert signal and a feedback signal according to the output signal, and the message and tuning subsystem transmits the alert signal to a user of the semiconductor manufacturing apparatus.

Another aspect of the present disclosure provides a system for monitoring a semiconductor manufacturing apparatus comprising an inspection unit capturing at least one image of a wafer, a sensor interface receiving the at least one image and generating at least one input signal for a database server, one or more processors, and one or more computer-readable non-transitory storage media. The one or more computer-readable non-transitory storage media is coupled to the one or more processors and includes instructions operable when executed by the one or more processors to cause the system to: receive the at least one input signal from the database server and perform a front end process to generate a data signal; perform an artificial intelligence (AI) analytical process to determine, according to the data signal, whether one or more damage marks has been caused by the semiconductor manufacturing apparatus and to generate an output signal; and generate an alert signal and a feedback signal according to the output signal, and transmit the alert signal to a user of the semiconductor manufacturing apparatus.

Another aspect of the present disclosure provides a method for controlling a semiconductor manufacturing apparatus comprising: capturing, by an inspection unit, at least one image of a wafer; receiving, by a sensor interface, the at least one image and generating at least one input signal for a database server; receiving, by a front end subsystem, the at least one input signal from the database server and performing a front end process to generate a data signal; receiving, by a calculation subsystem, the data signal from the front end subsystem, the calculation subsystem performing an artificial intelligence (AI) analytical process to determine, according to the data signal, whether one or more damage marks has been caused by the semiconductor manufacturing apparatus and generating an output signal; and generating, by a message and tuning subsystem, an alert signal and a feedback signal according to the output signal, the message and tuning subsystem transmitting the alert signal to a user of the semiconductor manufacturing apparatus.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A system for controlling a semiconductor manufacturing apparatus, comprising:
   an inspection unit capturing at least one image of a wafer;
   a sensor interface receiving the at least one image and generating at least one input signal for a database server; and
   a control unit comprising:
     a front-end subsystem receiving the at least one input signal from the database server and performing a front-end process to generate a data signal;
     a calculation subsystem receiving the data signal from the front end subsystem, wherein the calculation subsystem includes an AI analysis unit to perform an artificial intelligence (AI) analytical process to determine, according to the data signal, whether one or more damage marks has been caused by the semiconductor manufacturing apparatus and to generate an output signal including likelihood scores of the semiconductor manufacturing apparatus; wherein the AI analytical process performed by the calculation subsystem further utilizes a statistical model prediction to obtain the likelihood scores of the semiconductor manufacturing apparatus corresponding to the at least one image of the wafer of the data signal based on a set of training data including previously recorded wafer images of the semiconductor manufacturing apparatus used in the statistical model prediction, wherein the statistical model prediction performed by the AI analysis unit ranks a number of the semiconductor manufacturing apparatus according to the likelihood scores of the semiconductor manufacturing apparatus; and
a message and tuning subsystem generating an alert signal and a feedback signal according to the output signal including the likelihood scores of the semiconductor manufacturing apparatus, the message and tuning subsystem transmitting the alert signal to a user of the semiconductor manufacturing apparatus.

2. The system of claim 1, wherein the front-end process performed by the front-end subsystem comprises extracting, transforming, and/or loading the input signal from the database server.

3. The system of claim 1, wherein the AI analytical process performed by the calculation subsystem categorizes the at least one image of the wafer in the data signal into an undamaged wafer group and a damaged wafer group.

4. The system of claim 3, wherein the AI analytical process performed by the calculation subsystem further utilizes an object recognition algorithm to identify the one or more damage marks in the at least one image of the damaged wafer group, and a distance between the one or more damage marks is determined.

5. The system of claim 1, wherein the message and tuning subsystem transmits the feedback signal for an automated tuning process of the semiconductor manufacturing apparatus according to the output signal.

6. The system of claim 1, wherein the semiconductor manufacturing apparatus comprises one or more transfer robots.

7. A system for controlling a semiconductor manufacturing apparatus comprising:
an inspection unit capturing at least one image of a wafer;
a sensor interface receiving the at least one image and generating at least one input signal for a database server;
one or more processors; and
one or more computer-readable non-transitory storage media coupled to the one or more processors and comprising instructions operable when executed by the one or more processors to cause the system to:
receive the at least one input signal from the database server and perform a front-end process to generate a data signal
perform an artificial intelligence (AI) analytical process by utilizing a statistical model prediction to obtain likelihood scores of the semiconductor manufacturing apparatus corresponding to the at least one image of the wafer of the data signal, based on a set of training data to determine, according to the data signal, whether one or more damage marks has been caused by the semiconductor manufacturing apparatus and to generate an output signal including the likelihood scores of the semiconductor manufacturing apparatus, wherein the training data includes previously recorded wafer images of the semiconductor manufacturing apparatus used in the statistical model prediction;
with the statistical model prediction, ranking a number of the semiconductor manufacturing apparatus according to the likelihood scores of the semiconductor manufacturing apparatus; and
generate an alert signal and a feedback signal according to the output signal including the likelihood scores of the semiconductor manufacturing apparatus, and transmit the alert signal to a user of the semiconductor manufacturing apparatus.

8. The system of claim 7, wherein the front-end process comprises extracting, transforming, and/or loading the input signal from the database server.

9. The system of claim 7, the one or more computer-readable non-transitory storage media further comprising instructions operable when executed by the one or more processors to cause the system to perform the AI analytical process by categorizing the at least one image of the wafer in the data signal into an undamaged wafer group and a damaged wafer group.

10. The system of claim 9, the one or more computer-readable non-transitory storage media further comprising instructions operable when executed by the one or more processors to cause the system to perform the AI analytical process by further utilizing an object recognition algorithm to identify the one or more damage marks in the at least one image of the damaged wafer group, and to determine a distance between the one or more damage marks.

11. The system of claim 7, the one or more computer-readable non-transitory storage media further comprising instructions operable when executed by the one or more processors to cause the system to transmit the feedback signal for an automated tuning process of the semiconductor manufacturing apparatus according to the output signal.

12. The system of claim 7, wherein the semiconductor manufacturing apparatus comprises one or more transfer robots.

13. A method for controlling a semiconductor manufacturing apparatus comprising:
capturing, by an inspection unit, at least one image of a wafer;
receiving, by a sensor interface, the at least one image and generating at least one input signal for a database server;
receiving, by a front-end subsystem, the at least one input signal from the database server and performing a front-end process to generate a data signal;
receiving, by a calculation subsystem, the data signal from the front end subsystem, the calculation subsystem performing an artificial intelligence (AI) analytical process by utilizing a statistical model prediction to obtain a-likelihood scores of the semiconductor manufacturing apparatus corresponding to the at least one image of the wafer of the data signal based on a set of training data, to determine, according to the data signal, whether one or more damage marks has been caused by the semiconductor manufacturing apparatus and generating an output signal including the likelihood scores of the semiconductor manufacturing apparatus, wherein the training data includes previously recorded wafer images of the semiconductor manufacturing apparatus used in the statistical model prediction;
with the statistical model prediction, ranking a number of the semiconductor manufacturing apparatus according to the likelihood scores of the semiconductor manufacturing apparatus; and
generating, by a message and tuning subsystem, an alert signal and a feedback signal according to the output signal including the likelihood scores of the semiconductor manufacturing apparatus, the message and tuning subsystem transmitting the alert signal to a user of the semiconductor manufacturing apparatus.

14. The method of claim 13, wherein the front-end process performed by the front-end subsystem further comprises extracting, transforming, and/or loading the input signal from the database server.

15. The method of claim 13, wherein the AI analytical process performed by the calculation subsystem further comprises categorizing the at least one image of the wafer in the data signal into an undamaged wafer group and a damaged wafer group.

16. The method of claim 15, wherein the AI analytical process performed by the calculation subsystem further comprises utilizing an object recognition algorithm to identify the one or more damage marks in the at least one image of the damaged wafer group, and a distance between the one or more damage marks is determined.

17. The method of claim 13, further comprising transmitting, by the message and tuning subsystem, the feedback signal for an automated tuning process of the semiconductor manufacturing apparatus according to the output signal, wherein the semiconductor manufacturing apparatus comprises one or more transfer robots.

* * * * *